United States Patent
Kameshima et al.

(10) Patent No.: US 7,897,205 B2
(45) Date of Patent: Mar. 1, 2011

(54) FILM FORMING METHOD AND FILM FORMING APPARATUS

(75) Inventors: Takatoshi Kameshima, Kurayoshi (JP); Kohei Kawamura, Nirasaki (JP); Yasuo Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 588 days.

(21) Appl. No.: 11/910,983

(22) PCT Filed: Apr. 7, 2006

(86) PCT No.: PCT/JP2006/307475
§ 371 (c)(1),
(2), (4) Date: Oct. 9, 2007

(87) PCT Pub. No.: WO2006/109735
PCT Pub. Date: Oct. 19, 2006

(65) Prior Publication Data
US 2009/0061092 A1 Mar. 5, 2009

(30) Foreign Application Priority Data
Apr. 8, 2005 (JP) .................................. 2005-112625

(51) Int. Cl.
*C23C 16/00* (2006.01)
(52) U.S. Cl. ................. 427/237; 427/248.1; 427/255.27; 427/255.393
(58) Field of Classification Search ............... 427/248.1, 427/230, 237, 255.18, 255.27, 255.393
See application file for complete search history.

(56) References Cited

U.S. PATENT DOCUMENTS

| | | | |
|---|---|---|---|
| 2002/0181184 A1* | 12/2002 | Lee | 361/234 |
| 2003/0180459 A1* | 9/2003 | Redeker et al. | 427/248.1 |
| 2004/0166680 A1* | 8/2004 | Miyajima et al. | 438/689 |
| 2005/0085098 A1* | 4/2005 | Timmermans et al. | 438/794 |

FOREIGN PATENT DOCUMENTS

| | | |
|---|---|---|
| JP | 5-267480 | 10/1993 |
| JP | 11-67746 | 3/1999 |
| JP | 2004 115899 | 4/2004 |
| JP | 2004 193162 | 7/2004 |
| JP | 2004-244312 | 9/2004 |
| JP | 2005-129929 | 5/2005 |

* cited by examiner

*Primary Examiner* — David Turocy
(74) *Attorney, Agent, or Firm* — Oblon, Spivak, McClelland, Maier & Neustadt, L.L.P.

(57) ABSTRACT

A film forming method is characterized in that the method is provided with a step of introducing a processing gas including inorganic silane gas into a processing chamber, in which a mounting table composed of ceramics including a metal oxide is arranged, and precoating an inner wall of the processing chamber including a surface of the mounting table with a silicon-containing nonmetal thin film; a step of mounting a substrate to be processed on the mounting table precoated with the nonmetal thin film; and a step of introducing a processing gas including organic silane gas into the processing chamber, and forming a silicon-containing nonmetal thin film on a surface of the substrate mounted on the mounting table.

5 Claims, 6 Drawing Sheets

FILM FORMING METHOD AND FILM FORMING APPARATUS

FIELD OF THE INVENTION

The present invention relates to a film forming method and a film forming apparatus for forming a nonmetal film on a surface of a target substrate using an organic silane gas after performing a pre-coating process for attaching a thin film to surfaces of components in a processing chamber, including a surface of a mounting table, in advance.

BACKGROUND OF THE INVENTION

A film forming process is one of semiconductor manufacturing processes. The film forming process typically involves activating a processing gas in a vacuum atmosphere by, for example, converting it into plasma or thermally decomposing it; and depositing active species or reaction products on a substrate surface. A film forming apparatus for performing such a film forming process includes a mounting table disposed in a processing chamber which is configured as a vacuum chamber. As the mounting table, there can be used a ceramic plate which incorporates therein a temperature control unit for performing a temperature control of a substrate, the ceramic plate also serving as an electrostatic chuck by having a chuck electrode in a surface portion thereof.

FIG. 6A illustrates an example of such a mounting table 9. The mounting table 9 of FIG. 6A is formed of a ceramic plate disposed on a support 91 made of, e.g., aluminum. Installed inside the support 91 to penetrate it are, e.g., three elevating pins 92 for performing a transfer of a substrate 10 from/to a transfer mechanism (not shown). Further, a foil-shaped electrode 93 for attracting and holding the target substrate is embedded in the mounting table 9 formed of the ceramic plate.

Meanwhile, the film forming apparatus performs a so-called pre-coating process before the substrate 10 is mounted on the mounting table 9. The pre-coating process is a process for forming a film 100, which is identical with a film 100 to be formed on the surface of the substrate 10, on the surface of the mounting table 9 and the inner wall of a processing chamber (not shown). The reason why this pre-coating process is performed is as follows. If the inner wall of the processing chamber or the surface of the mounting table 9 is exposed, a rate of a thin film being attached to the inner wall and the like is high at an initial stage immediately after starting the film forming process. The attachment rate (a film forming rate), however, becomes stabilized after the attachment of the thin film to the inner wall and the like is made to some extent. Due to this discrepancy in processing environment, there is likelihood that several substrates 10 processed at the initial stage of the film forming process would not satisfy expected specifications. The pre-coating process is effective to avoid the possible problems as described above (see, for example, Japanese Patent Laid-open Application No. 2004-096060).

Further, during the film forming process, it might happen that components of the pre-coated films attached to the inner wall and so forth are dispersed to the surface of the substrate 10. Thus, it is required that the components of the pre-coated films are identical or similar to those of films to be processed (so that no affection is made on the films on the surface of the substrate 10 even if the pre-coated films attached to the inner wall are dispersed and mixed into the films on the surface of the substrate 10).

There is still another reason why the pre-coating process is performed on the surface of the mounting table 9. Aluminum nitride is widely used for the ceramic plate forming the mounting table 9. When the substrate 10 is lowered and placed on the mounting table 9 after being received by the elevating pins 92, the substrate 10 and the ceramic plate would be slightly scratched against each other due to slight horizontal misalignment between the substrate 10 and the mounting table 9. In such a case, the aluminum nitride is attached to the rear surface of the substrate 10. According to an analysis result of the present inventors, the quantity of aluminum attached to the rear surface of the substrate 10 was about $5 \times 10^{10}$ atoms/cm$^2$. Though this is an infinitesimal quantity, it might cause a metal contamination in a manufacturing line. Therefore, it is effective to perform the pre-coating process on the surface of the mounting table 9.

There is a case of performing a film formation using an organic silane gas, e.g., trimethylsilane ($SiH(CH_3)_3$) gas as a processing gas. For example, a formation of a SiCN film (carbon and nitrogen containing silicon film) is performed by adding nitrogen ($N_2$) gas to the trimethylsilane gas. Here, the ceramic plate made of the aluminum nitride is obtained through the steps of adding and mixing powders of titanium oxide (TiO) to and with powders of aluminum nitride as a binder, as shown in FIG. 6B; pressing and molding the mixture and sintering them. Thus, problems as follows can occur. If a pre-coating is performed on the SiCN film by using the organic silane gas, TiO contained in the aluminum nitride reacts with H of the trimetyhlsilane ($SiH(CH_3)_3$), generating Ti, as indicated by a reaction formula (1) as bellows.

$$TiO + 2H \rightarrow Ti + H_2O \qquad (1)$$

The amount of Ti generated while forming the pre-coat film is at a level that causes no problem. However, since the number of hydrogen atoms contained in a single molecule of the organic silane gas is great, the amount of hydrogen contained (trapped) in the pre-coated film will be also great. Due to the presence of this hydrogen, the Ti is generated with a lapse of time after the completion of the pre-coating. Ti thus generated is transferred to a rear surface of the substrate when the substrate is mounted on the mounting table. For example, as for a mounting table pre-coated with a SiCN film using trimethylsilane, the quantity of Ti transferred to the rear surface of a substrate immediately after the pre-coating process was about $5 \times 10^{10}$ atoms/cm$^2$. However, the quantity reached up to about $5 \times 10^{13}$ atoms/cm$^2$ in 2 or 3 days.

SUMMARY OF THE INVENTION

It is, therefore, an object of the present invention to provide a technique capable of preventing metal contamination in performing, by using an organic silane gas, a film forming process on a target substrate mounted on a mounting table which is made of a ceramic plate containing a metal oxide.

In accordance with a first aspect of the present invention, there is provided a film forming method including: pre-coating an inner wall of a processing chamber including a surface of a mounting table made of ceramic containing a metal oxide and disposed in the processing chamber with a silicon-containing nonmetal thin film, by introducing a processing gas containing an inorganic silane gas into the processing chamber; mounting a target substrate on the mounting table pre-coated with the nonmetal thin film; and forming a silicon-containing nonmetal thin film on a surface of the target substrate mounted on the mounting table, by introducing a processing gas containing an organic silane gas into the processing chamber.

In accordance with the present invention, since the processing gas containing the inorganic silane gas (which has a small number of hydrogen atoms per a single molecule) is used in the pre-coating process; therefore, even if a metal oxide (e.g., TiO), which is contained in the ceramic plate forming the mounting table as, e.g., a binder, reacts with the hydrogen and a metal (in this case, Ti) generated as a result of such reaction infiltrates into the pre-coated film (the film formed by the pre-coating process), the amount infiltrated is very small. Accordingly, it is possible to greatly reduce the probability of metal contamination of the target substrate due to the transfer of the metal to the target substrate from the pre-coated film on the mounting table.

For example, when pre-coating the inner wall of the processing chamber (including the surfaces of the mounting table and other parts therein) by using the inorganic silane gas, the pre-coated film and the film formed on the target substrate have same or similar properties because the inorganic silane gas belongs to a silane gas, like the organic silane gas used as the processing gas in performing the film forming process on the target substrate. Thus, even if components of the pre-coated film are dispersed, an adverse effect on the film on the substrate can be reduced.

In accordance with a second aspect of the present invention, there is also provided a film forming method including: pre-coating an inner wall of a processing chamber including a surface of a mounting table made of ceramic containing a metal oxide and disposed in the processing chamber with a first silicon-containing nonmetal thin film, by introducing a processing gas containing an inorganic silane gas into the processing chamber; mounting a dummy substrate on the mounting table pre-coated with the first nonmetal thin film; removing the first nonmetal thin film formed on other regions of the mounting table than that covered with the dummy substrate, by introducing a cleaning gas for removing the first nonmetal thin film into the processing chamber; pre-coating the inner wall of the processing chamber and the surface of the mounting table on which the dummy substrate is mounted with a second silicon-containing nonmetal thin film, by introducing a processing gas containing an organic silane gas; unloading the dummy substrate from the processing chamber; mounting a target substrate on the mounting table after the dummy substrate is unloaded; and forming a silicon-containing nonmetal thin film on a surface of the target substrate mounted on the mounting table, by introducing a processing gas containing an organic silane gas.

Also with the method of the second aspect, the processing gas containing the inorganic silane gas (which has a small number of hydrogen atoms per a single molecule) is used in the pre-coating process; therefore, even if a metal oxide (e.g., TiO), which is contained in the ceramic plate forming the mounting table as, e.g., a binder, reacts with the hydrogen and a metal (in this case, Ti) generated as a result of such reaction infiltrates into the pre-coated film (the film formed by the pre-coating process), the amount infiltrated is very small. Accordingly, it is possible to greatly reduce the probability of metal contamination of the target substrate due to the transfer of the metal to the target substrate from the pre-coated film on the mounting table.

In particular, among the surface of the mounting table made of ceramic plate, by means of using the dummy substrate, a pre-coated film is formed only on the mounting table's surface area on which the target substrate is placed by using the inorganic silane gas (which can contain other gases as well). On the other regions including the inner wall of the processing chamber, a pre-coat film is formed by using the organic silane gas (which can contain other gases as well). Thus, the latter pre-coated film and the film formed on the target substrate are made of a same material. Accordingly, even if the components of the pre-coated film are dispersed, an adverse effect on the film on the target substrate can be completely avoided. In this regard, the method of the second aspect is more advantageous than that of the first aspect. Thus, if an operator determines that an adverse effect can be caused on the film formed on the target surface in the method in accordance with the first aspect, it is possible to employ the method of the second aspect instead.

Further, the inner wall of the processing chamber including the surface of the mounting table may include surfaces of parts of the gas supply units exposed to the processing atmosphere. Further, the "pre-coating" refers to a process for forming a thin film in the processing chamber in advance prior to forming a thin film on the target substrate.

It is preferred that the inorganic silane gas is a monosilane gas, a disilane gas or a dichlorosilane gas.

Further, it is preferred that the silicon-containing nonmetal thin film formed by using the processing gas containing the organic silane gas is a carbon and nitrogen containing silicon film (SiCN film), a carbon-containing silicon oxide film (SiCO film) or a carbon and hydrogen containing silicon film (SiCH film).

Also, it is preferred that a titanium oxide, which is a metal oxide, is contained in the mounting table as a binder.

In accordance with a third aspect of the present invention, there is provided a film forming apparatus including: a processing chamber in which a mounting table for mounting a substrate thereon is disposed; a first processing gas supply unit for introducing a processing gas containing an inorganic silane gas into the processing chamber; a second processing gas supply unit for introducing a processing gas containing an organic silane gas into the processing chamber; a substrate transfer mechanism for transferring the substrate to/from the mounting table; and a control unit for controlling the first processing gas supply unit, the second processing gas supply unit and the substrate transfer mechanism to perform the film forming method described above.

In accordance with a fourth aspect of the present invention, there is provided a computer executable program, executed by a computer for controlling a film forming apparatus including: a processing chamber in which a mounting table for mounting a substrate thereon is disposed; a first processing gas supply unit for introducing a processing gas containing an inorganic silane gas into the processing chamber; a second processing gas supply unit for introducing a processing gas containing an organic silane gas into the processing chamber; and a substrate transfer mechanism for transferring the substrate to/from the mounting table, wherein the computer executable program realizes the film forming method described above.

Preferably, in an example, the computer executable program is made to execute pre-coating an inner wall of a processing chamber including a surface of a mounting table made of ceramic containing a metal oxide and disposed in the processing chamber with a silicon-containing nonmetal thin film, by introducing a processing gas containing an inorganic silane gas into the processing chamber; mounting a target substrate on the mounting table pre-coated with the nonmetal thin film; and forming a silicon-containing nonmetal thin film on a surface of the target substrate mounted on the mounting table, by introducing a processing gas containing an organic silane gas into the processing chamber.

In another example, the computer executable program is made to execute pre-coating an inner wall of a processing chamber including a surface of a mounting table made of ceramic containing a metal oxide and disposed in the processing chamber with a first silicon-containing nonmetal thin film, by introducing a processing gas containing an inorganic silane gas into the processing chamber; mounting a dummy substrate on the mounting table pre-coated with the first nonmetal thin film; removing the first nonmetal thin film formed on other regions of the mounting table than that covered with the dummy substrate, by introducing a cleaning gas for removing the first nonmetal thin film into the processing chamber; pre-coating the inner wall of the processing chamber and the surface of the mounting table on which the dummy substrate is mounted with a second silicon-containing nonmetal thin film, by introducing a processing gas containing an organic silane gas; unloading the dummy substrate from the processing chamber; mounting a target substrate on the mounting table after the dummy substrate is unloaded; and forming a silicon-containing nonmetal thin film on a surface of the target substrate mounted on the mounting table, by introducing a processing gas containing an organic silane gas.

DETAILED DESCRIPTION OF THE EMBODIMENTS

Figure 1:
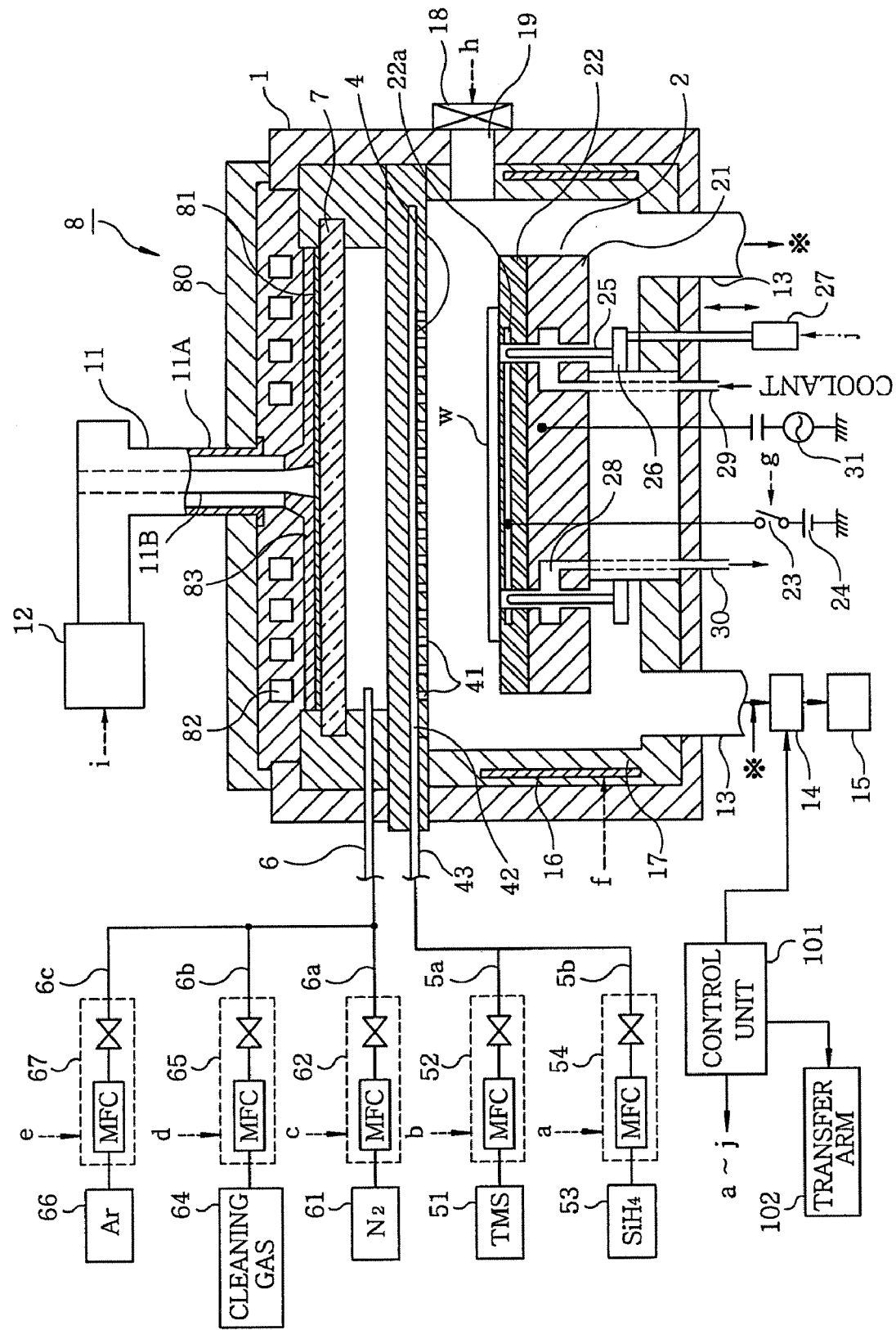
FIG. 1 is a schematic cross sectional view illustrating an embodiment of a film forming apparatus (plasma processing apparatus) for performing a film forming method in accordance with the present invention.

An exemplary plasma processing apparatus employed in a film forming method in accordance with the present invention will be described with reference to FIGS. 1 and 2. In FIG. 1, a processing chamber (vacuum chamber) 1 is made of, e.g., aluminum, and a mounting member 2 having, e.g., a cylindrical shape is disposed in the processing chamber 1. The mounting member 2 includes a support 21 made of, e.g., aluminum and a mounting table 22 disposed on the support 21. The mounting table 22 is made of a ceramic plate having a thickness of, e.g., about 10 mm. Further, a foil-shaped electrode 22a is buried in the mounting table 22. The electrode 22a is connected to a DC power supply 24 via a switch 23.

In this embodiment, the mounting table 22 is fabricated by mixing powders of aluminum nitride (AlN) with powders of titanium oxide (TiO) as a binder. The aluminum nitride powders contain about 0.1% of titanium oxide powders.

Installed inside the mounting table 2 to penetrate it are, e.g., three elevating pins 25 which serve to receive and transfer a wafer W from and to a transfer mechanism 102. The elevating pins 25 are movable up and down by an elevation mechanism 27 provided outside the processing chamber 1 via a support member 26, whereby leading ends of the elevating pins 25 are moved between a transfer position protruded above the mounting table 22 and a standby position retracted in the mounting table 22.

Further, formed inside the support 21 is a path 28 for a temperature control medium which is used as a temperature control means. A coolant serving as the temperature control medium is introduced into the path 28 via an inlet line 29 and is discharged via an outlet line 30 after circulating through the path 28. By means of this temperature control medium and a heater (not shown), the temperature of a to-be-processed semiconductor wafer W mounted on the mounting table 22 is maintained at a specific temperature level. Moreover, a high frequency bias power supply 31 of, e.g., about 13.56 MHz is connected to the support 21.

Besides, disposed above the mounting table 2 is a first gas supply unit 4 which is made of a conductor such as aluminum and is configured as, e.g., a substantially disk-shaped gas shower head. The first gas supply unit 4 is provided with a number of gas injection openings 41 at its surface facing the mounting table 22. Formed inside the first gas supply unit 4 are grid-patterned gas channels 42 which communicate with the gas injection openings 41. The gas channels 42 are connected with a gas supply line 43.

As shown in FIG. 1, an upstream side of the gas supply line 43 divided into branch lines 5a and 5b. Connected to the branch line 5a via a gas supply kit 52 is a gas supply source 51 for a vapor obtained by vaporizing an organic silane gas such as trimethysilane ($SiH(CH_3)_3$) which is used as a processing gas. Further, connected to the other branch line 5b via a gas supply kit 54 is a gas supply source 53 for an inorganic silane gas such as $SiH_4$ gas which is used as a processing gas. Each of the gas supply kits 52 and 54 includes a valve, a mass flow controller serving as a flow rate control unit, and so forth, and they serve to control the supply of gas.

Figure 2:
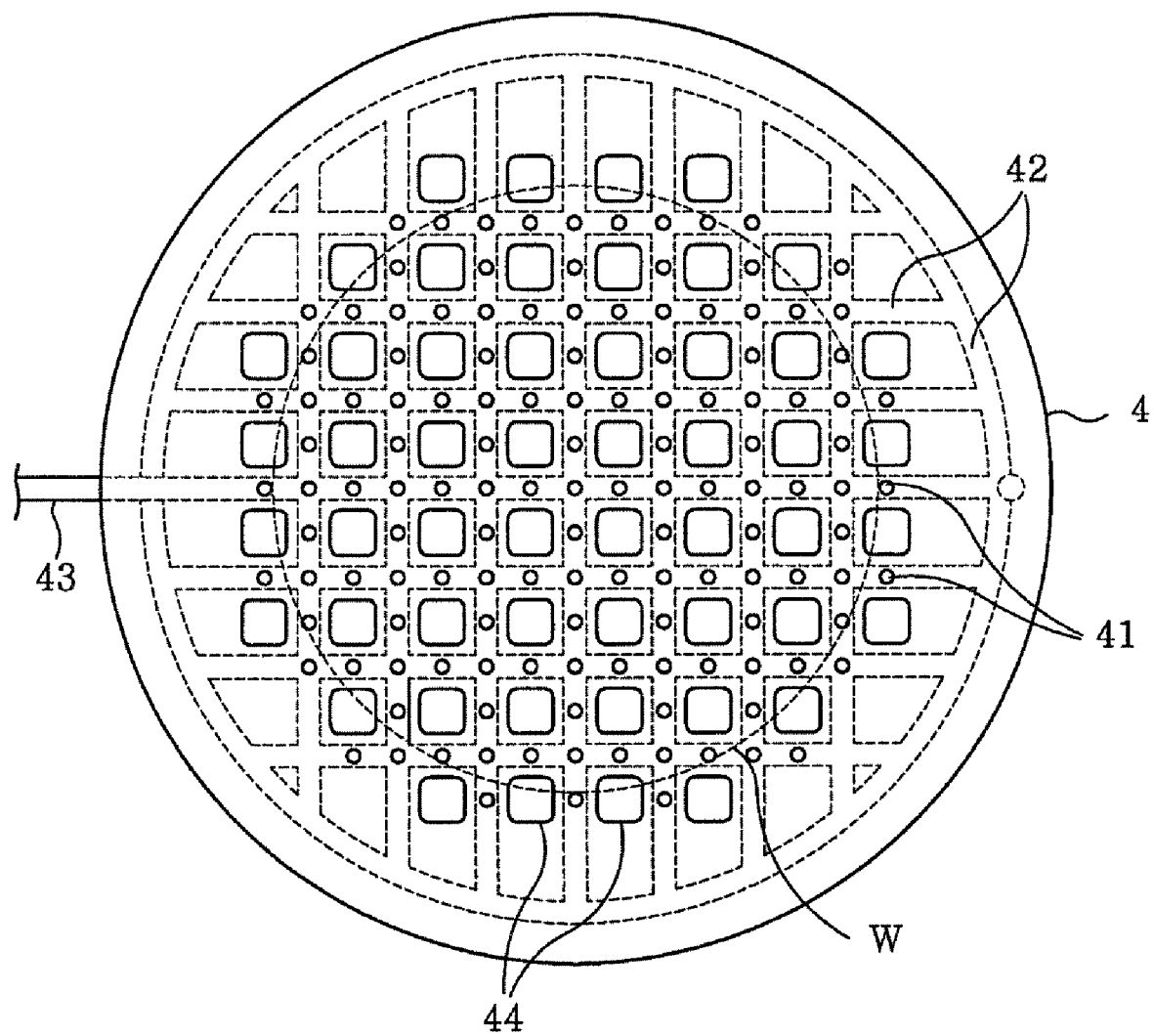
FIG. 2 sets forth a plan view showing a part of a first gas supply unit provided in the film forming apparatus of FIG. 1.

Moreover, referring to FIG. 2, the first gas supply unit 4 is provided with a multiplicity of openings 44 that are provided to vertically penetrate the first gas supply unit 4. As shown in FIG. 2, for example, the openings 44 are formed between neighboring gas channels 42 to allow plasma generated in a space above the first gas supply unit 4 to flow into a space below the first gas supply unit 4.

Furthermore, disposed above the first gas supply unit 4 is a gas supply line 6 which serves as a second gas supply unit. An upstream side of the gas supply line 6 divided into branch lines 6a to 6c. Connected to the branch lines 6a to 6c via gas supply kits 62, 65, 67 are gas supply source 61, 64, 66 for supplying $N_2$ gas as a processing gas, a cleaning gas, and Ar gas as a plasma gas, respectively. Each of the gas supply kits 62, 65 and 67 includes a valve, a mass flow controller serving as a flow rate control unit, and so forth, and they serve to control the supply of gas.

Disposed above the second gas supply unit 6 is a dielectric plate (microwave transmitting window) 7, and an antenna section 8 is disposed on the dielectric plate 7 to be in close contact with the dielectric plate 7. The antenna section 8 includes a circular flat antenna main body 80; and a disk-shaped planar antenna member 81 (slot plate) which is installed at a bottom surface of the antenna main body 80 via a retardation plate 83 and provided with a number of slot pairs. Each of the antenna main body 80 and the planar antenna member 81 is made of a conductor, and they are connected to a coaxial waveguide 11, while forming a circular flat and hollow wave guide together. The antenna main body 80, the planar antennal member 81 and the retardation plate 83 constitute a radial line slot antenna (RLSA).

The antenna section 8 is connected to an external microwave generator 12 via the coaxial waveguide 11. An outer waveguide 11A of the coaxial waveguide 11 is connected to the antenna main body 80, while a central conductor 11B of the coaxial waveguide 11 is connected to the planar waveguide member 81 via an opening provided in the retardation plate 83.

Further, a gas exhaust line 13 is coupled to a bottom portion of the processing chamber 1. A vacuum pump 15 serving as a vacuum exhaust unit is connected to a basal end side of the gas exhaust line 13 via a pressure control unit including, e.g., a butterfly valve or the like. In addition, a fence member (wall portion) having therein a heater 16 serving as a heating unit is disposed inside the inner wall of the processing chamber 1. Further, a loading/unloading port 19 for a wafer W is provided in a lower space of the processing chamber 1, wherein the port 19 is opened or closed by a gate valve 18.

Furthermore, the plasma processing apparatus includes a control unit 100 made up of, e.g., a computer. The control unit 101 controls the gas supply kits 52, 54 and 62, the pressure control unit 14, the heater 16, the microwave generator 12, the electrostatic chuck switch 23 of the mounting table 22, the gate valve 18, the elevation mechanism 27, and so forth. Further, though its specific structure is not shown, a transfer arm 102 serving as a transfer mechanism for transferring a wafer W to and from the mounting table 22 is provided outside the processing chamber 1. As indicated by a block diagram in a lower side of FIG. 1, the control unit 101 also controls the transfer arm 102.

Furthermore, the control unit 101 also includes a memory for storing sequence programs for executing a series of processes to be described later in the processing chamber 1, an output unit for reading commands of each program and outputting control signals to each component, and so forth.

First Embodiment

Figure 3A:
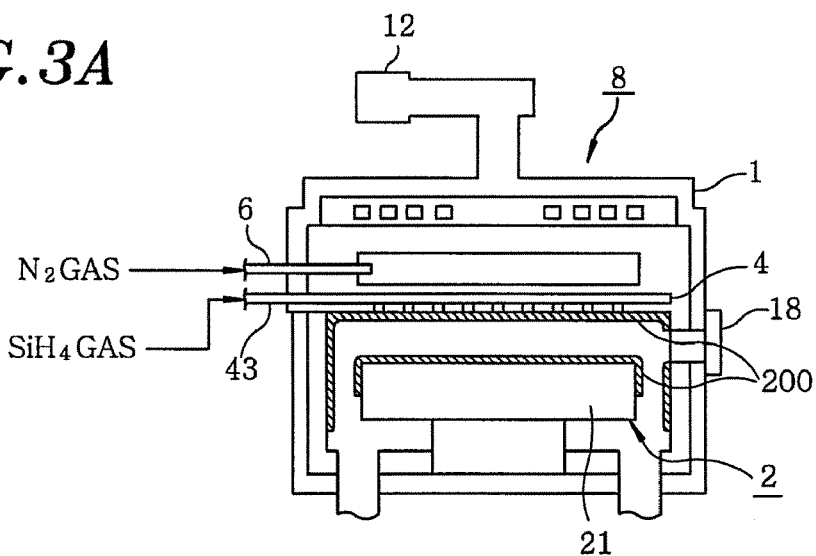
FIGS. 3A to 3C are schematic diagrams illustrating a process flow of a first embodiment of the film forming method in accordance with the present invention.

Now, a series of processes performed in accordance with a first embodiment of the present invention will be described with reference to FIGS. 3A to 3C.

First, a pre-coating process is performed before a target substrate is loaded into the processing chamber 1. That is, while vacuum-evacuating the processing chamber 1 to a specific pressure level, $N_2$ gas is supplied into the processing chamber 1 via the gas supply line 6 which is the second gas supply unit, and an inorganic silane gas, e.g., monosilane ($SiH_4$) gas is supplied as a processing gas from the first gas supply unit 4 via the gas supply line 43. The internal pressure of the processing chamber 1 is maintained at a specific process pressure level, and the surface temperature of the mounting table 22 is regulated at a certain temperature level, e.g., about 380° C.

Meanwhile, a high frequency wave (microwave) of, e.g., about 2.45 GHz and 2000 W is supplied from the microwave generator 12. The microwave propagates through the coaxial waveguide 11 in a TM mode, a TE mode or a TEM mode and reaches the planar antennal member 81 of the antenna section 8. While being radially transmitted from the center of the planar antenna member 81 to its periphery, the microwave is emitted through the slot pairs and the dielectric plate 7 toward a processing space thereunder.

At this time, along the array of the slot pairs, a circularly polarized wave is uniformly emitted to the entire planar surface of the planar antenna member 81, whereby an electric field density in the processing space is made uniform. Further, the $N_2$ gas is activated by the energy of the microwave, so that high-density plasma is uniformly excited in the space above the first gas supply unit 4. The plasma (active species) of nitrogen flows into the processing space below the first gas supply unit 4 through the openings 44 of the first gas supply unit 4. Meanwhile, the $SiH_4$ gas supplied into the processing space from the first gas supply unit 4 is activated by the active species of nitrogen flown into the processing space, whereby a $Si_3N_4$ (silicon nitride) film 200 is formed on the surface of the mounting table 22, the inner wall of the processing chamber 1, the surface of the first gas supply unit 4, and so forth as a pre-coat film in a thickness of, e.g., about 5 nm, as illustrated in FIG. 3A. Then, the pre-coating process is completed. Though the $Si_3N_4$ film is formed by using the $SiH_4$ gas and the $N_2$ gas in this embodiment, the $Si_3N_4$ film may be formed by using $Si_2H_6$ gas instead of the $SiH_4$ gas.

Figure 3B:
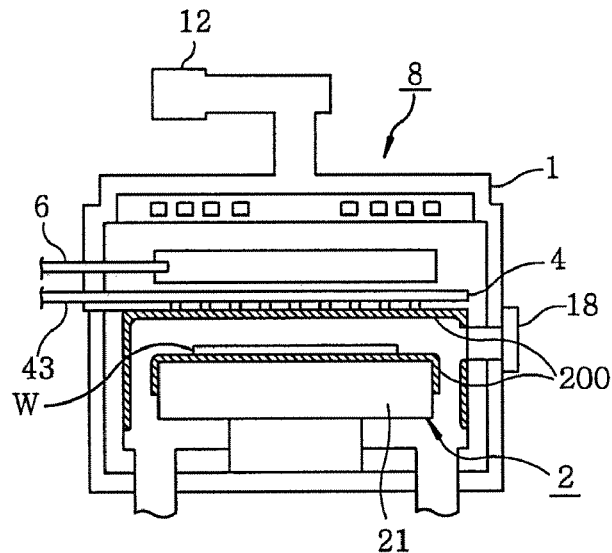

Then, as shown in FIG. 3B, by the transfer arm 102 (see FIG. 1), a substrate to be processed, i.e., a wafer W having an interlayer dielectric already formed thereon is mounted on the mounting table 22, which is coated with the $Si_3N_4$ film 200 through the pre-coating process described above. The wafer W mounted on the mounting table 22 is adsorptively held on the mounting table 22 by a Coulomb force generated by a DC voltage applied to the electrode 22a from the DC power supply 24.

Figure 3C:
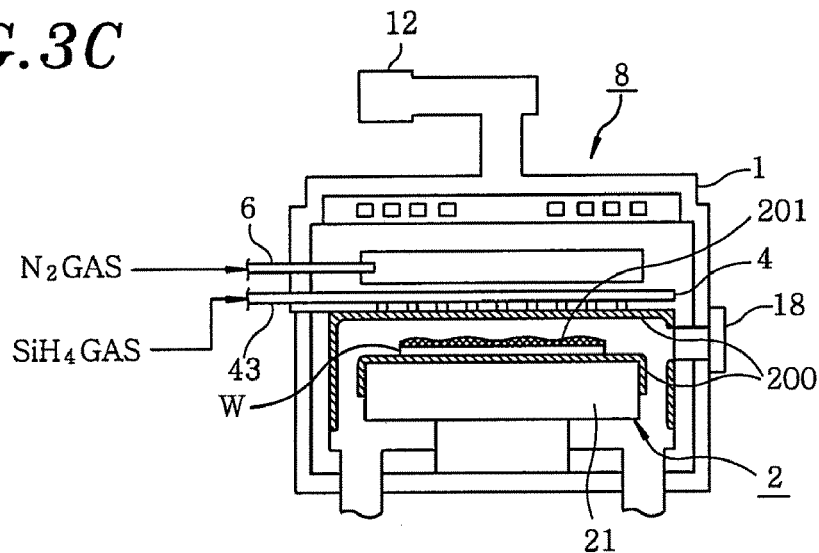

Subsequently, as illustrated in FIG. 3C, a SiCN film (carbon-containing silicon nitride film) 201 is formed on the surface of the wafer W as a hard mask, for example. Here, $N_2$ gas is supplied through the gas supply line 6 which serves as the second gas supply unit and, also, an organic silane gas, e.g., trimethylsilane ($SiH(CH_3)_3$) gas is supplied as a processing gas from the first gas supply unit 4 through the gas supply line 43. Then, as described above, the $N_2$ and the $SiH(CH_3)_3$ are converted into plasmas by the energy of microwaves from the microwave generator 12, and a SiCN film 201 is formed on the surface of the wafer in a thickness of, e.g., about 5 nm.

After the film formation on the wafer W is completed, the wafer W is unloaded. Then, next wafers W to be processed are loaded sequentially, and the same film forming process as described above is performed on them. After the film forming process has been performed on a preset number of wafers W, the inside of the processing chamber 1 is cleaned to remove the film attached to each component. Thereafter, the pre-coating process, that is the initial step, is performed again, and the series of processes as described above are performed repeatedly. Further, the gas for obtaining active species of nitrogen in forming the $Si_3N_4$ and SiCN films is not limited to the nitrogen gas but ammonia gas can be employed instead.

In accordance with the first embodiment, in forming the hard mask of SiCN film by using the organic trimethylsilane gas as a processing gas, the monosilane gas, which is an inorganic silane gas, is used as processing gas in the pre-coating process. Since the number of hydrogen atoms contained in a single molecule of the monosilane gas is small (four), the quantity of hydrogen contained in the pre-coated film is also small. Thus, the quantity of Ti generated with the lapse of time is kept at a negligible level, so that the probability of metal contamination due to a transfer of Ti to a backside of the wafer can be reduced greatly. In practice, a Ti contamination amount at the wafer backside was measured by using the mounting table on which the pre-coated film is formed in accordance with the first embodiment of the present invention. As a result, measured values were below a detection limit ($1 \times 10^{10}$ atoms/$cm^2$) both when measured immediately after the pre-coating process and when measured after 2 or 3 days.

Further, in this embodiment, the pre-coating is performed on the inside (inner wall, mounting table 22 and other components) of the processing chamber 1 is performed by using the monosilane gas. This monosilane gas belongs to a silane gas, like the trimethylsilane gas which is used as the processing gas for the film forming process, and the pre-coated $Si_3N_4$ film 200 and the SiCN film 201 formed on the wafer W can be said to have similar properties. As described above, for first several wafers W processed right after the pre-coating process, there is a probability that components dispersed from the pre-coated film ($Si_3N_4$ film) due to its contact with the plasma may enter the thin film (SiCN film) because the plasma exists in the processing atmosphere when performing the film forming process on the wafer W. However, the dispersed amount is very small and the two films have similar properties, so that an adverse influence thereof is negligible.

The possible adverse influence should be estimated by an operator by considering types of films formed, thicknesses of the films, locations of the films on the device, and so forth. The method in accordance with the above-described embodiment is valid when the adverse influence is determined negligible.

Second Embodiment

Now, a series of processes performed in accordance with a second embodiment of the present invention will be explained with reference to FIGS. 4A to 5C.

Figure 4A:
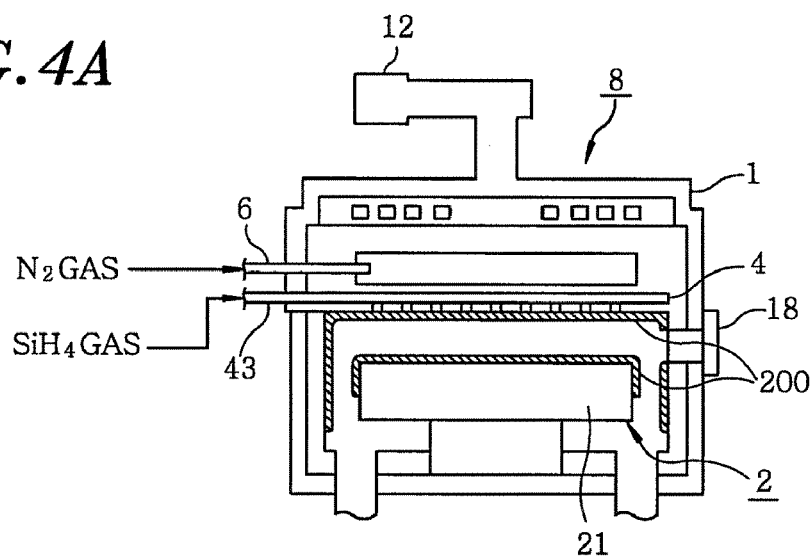
FIGS. 4A to 4C are schematic diagrams illustrating a process flow of a second embodiment of the film forming method in accordance with the present invention.

First, a pre-coating process is performed before a target substrate is loaded into the processing chamber 1. As in the first embodiment, by using $SiH_4$ gas and $N_2$ gas, a $Si_3N_4$ film 200 is formed on the surface of the mounting table 22, the inner wall of the processing chamber 1, the surface of the first gas supply unit 4 and so forth as a first pre-coat film in a thickness of, e.g., about 5 nm, as illustrated in FIG. 4A.

Figure 4B:
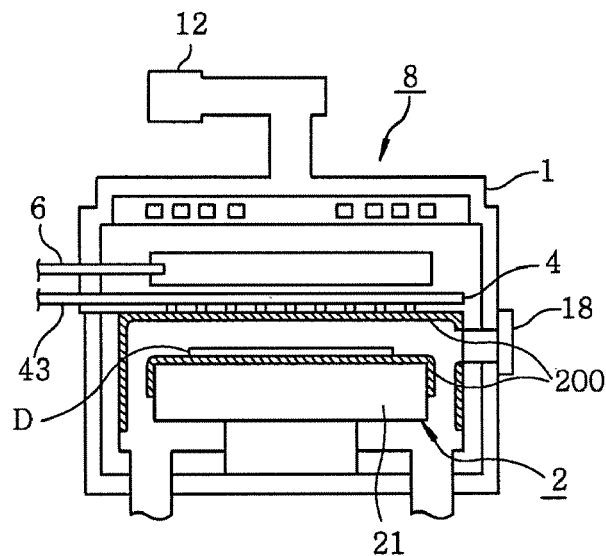
Figure 4C:
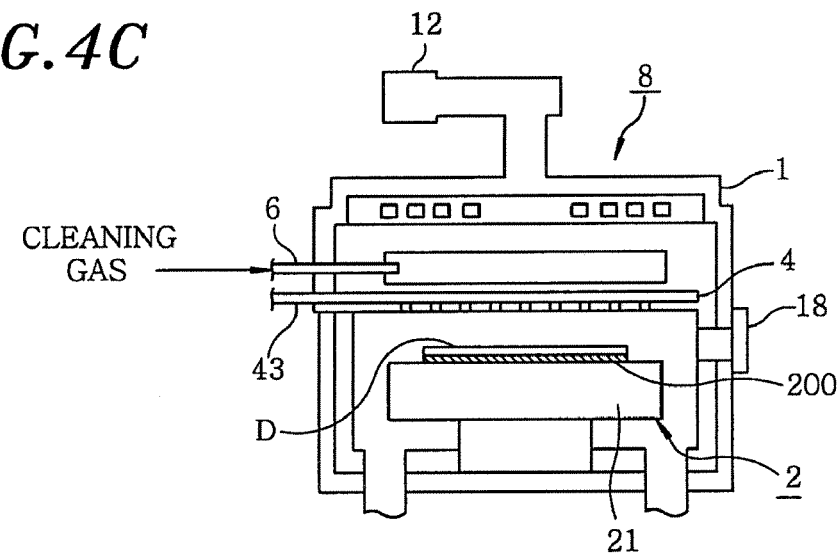

Subsequently, as illustrated in FIG. 4B, by means of the transfer arm 102 (see FIG. 1), a dummy substrate D having the same size as a wafer W is mounted on the mounting table 22 which is coated with the $Si_3N_4$ film 200 through the pre-coating process described above. The dummy substrate D mounted on the mounting table 22 is electrostatically attracted to and held on the mounting table 22 by a Coulomb force generated by a DC voltage applied to the electrode 22a from the DC power supply 24.

Next, a cleaning gas, e.g., a CF-based gas and/or a CHF-based gas is introduced into the processing chamber 1 from the cleaning gas supply source 64, whereby the inside of the processing chamber 1 is cleaned. As a result, among the $Si_3N_4$ film 200 formed on the surface of the mounting table 22, the film deposited on portions of the mounting table 22 other than the area below the dummy substrate D (i.e., the area covered with the dummy substrate D) are removed. Further, the $Si_3N_4$ film 200 formed on the inner wall of the processing chamber 1 and the like is also removed.

Figure 5A:
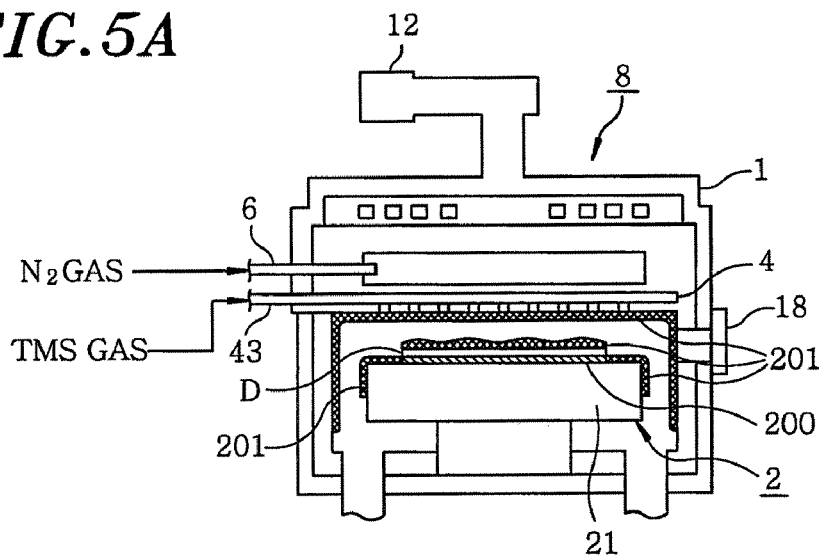
FIGS. 5A to 5C are schematic diagrams illustrating a process flow of a third embodiment of the film forming method in accordance with the present invention.

Subsequently, as shown in FIG. 5A, trimethysilane gas and $N_2$ gas are introduced into the processing chamber 1 as a processing gas, and according to the same principle as that of the SiCN film forming process in the first embodiment, a SiCN film 201 is formed on the surface of the mounting table 22, the inner wall of the processing chamber 1, the surface of the first gas supply unit 4, and so forth as a second pre-coat film in a thickness of, e.g., about 5 nm.

In this case, since the dummy substrate D is placed on the mounting table 22, the mounting table 22's area below the dummy substrate D remains uncoated with the SiCN film which is the second pre-coat film.

Figure 5B:
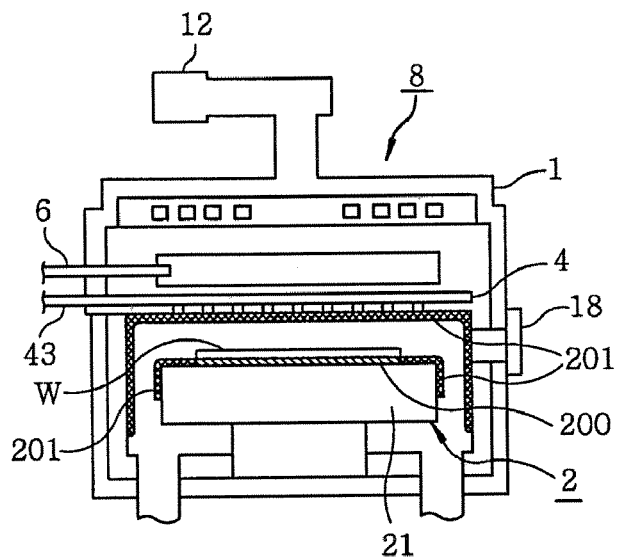

Subsequently, as illustrated in FIG. 5B, the dummy substrate placed on the mounting table 22 is unloaded from the processing chamber 1, and a wafer W having an interlayer dielectric formed in advance is loaded into the processing chamber as a target substrate to be processed and is mounted on the mounting table 22 to be electrostatically held thereon.

Figure 5C:
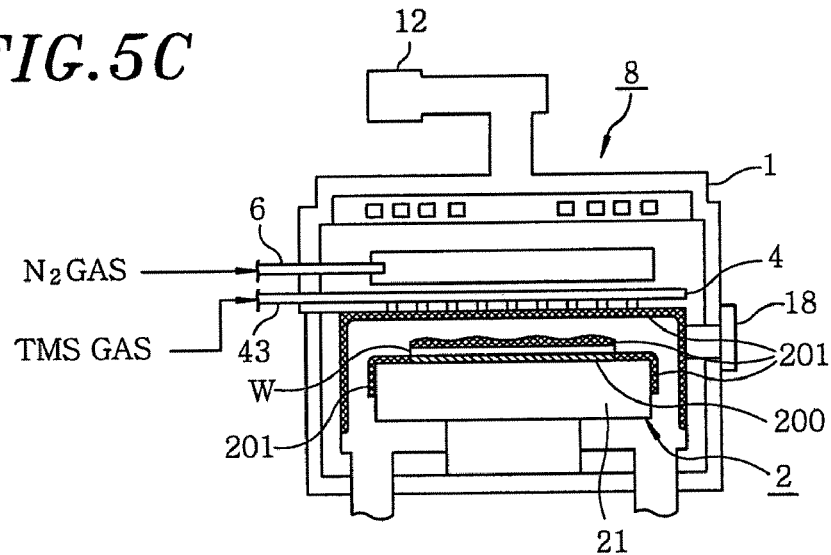
Figure 6A:
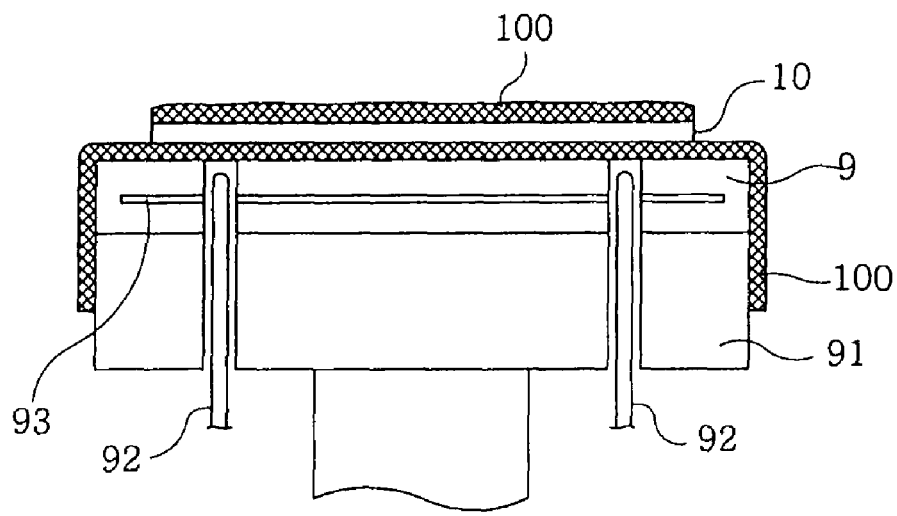
FIG. 6A is a vertical cross sectional view showing a mounting table of a conventional film forming apparatus and FIG. 6B provides a diagram describing a generation of Ti from titanium oxide (TiO) which is a binder of the mounting table.
Figure 6B:
Figure 6B:
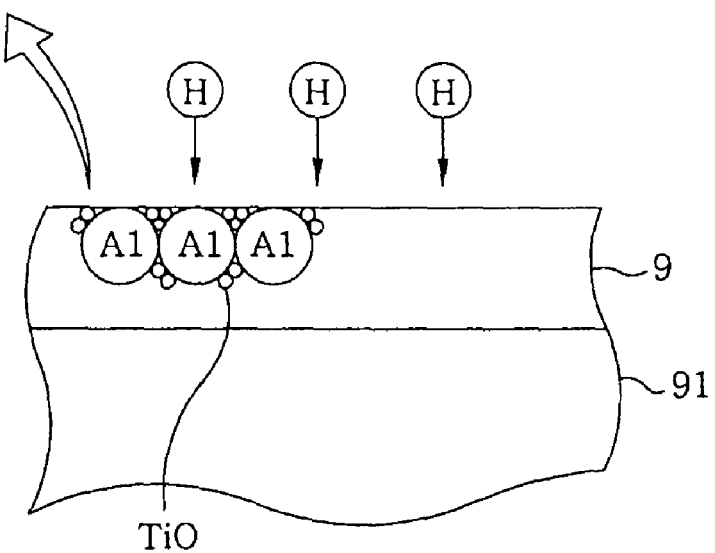

Thereafter, by using the trimethylsilane gas and the $N_2$ gas, a SiCN film 201 is formed on the surface of the wafer W, which is mounted on the mounting table 22, as a hard mask in a thickness of, e.g., about 5 nm, as illustrated in FIG. 5C. Afterward, the wafer W is unloaded from the processing chamber 1 and next wafers W are loaded thereinto sequentially to be subjected to the same film forming process.

In accordance with the second embodiment, by means of using the dummy substrate D, the $Si_3N_4$ film 200, which is the first pre-coat film, is formed only on the surface area of the mounting table 22 on which the wafer W is placed, by using the monosilane gas which is an inorganic silane gas. On the other regions including the inner wall of the processing chamber 1, the SiCN film 201 which is the second pre-coat film is formed by using the trimethysilane gas, which is an organic silane gas. Accordingly, since the pre-coat film formed based on the inorganic silane gas is present on the region of the mounting table 22 on which the wafer W is placed, a reduction amount of TiO in the aluminum nitride forming the mounting table 22 is small, so that the amount of Ti contained in that pre-coated film is small and the amount of Ti transferred to the wafer W can be reduced. Further, since the second pre-coat film formed in the processing chamber 1 and the film formed on the wafer W are same kinds (SiCN film 201 in this embodiment), no adverse effect is caused on the film on the wafer W due to the dispersion of the components of the second pre-coat film. In this regard, the second embodiment is more advantageous than the first embodiment.

Here, it is to be noted that, in the second embodiment, forming the second pre-coat film by using an inorganic silane gas is included in the scope of the present invention, at least at the time of filing of this application.

Further, in the present invention, the pre-coat film is not limited to the $Si_3N_4$ film. For example, when forming $SiO_2$ film on a target substrate by using an organic silane gas, e.g., TEOS gas and $O_2$ (oxygen) gas, it is preferable to form the $SiO_2$ film as a pre-coat film by using, e.g., $SiH_4$ gas, $Si_2H_6$ gas, $SiCl_2H_2$ gas, or the like together with $O_2$ gas in a pre-coating process using an inorganic silane gas.

Moreover, in the pre-coating process using the inorganic silane gas, a polysilicon film may be formed by using, e.g., $SiH_4$ gas at a processing temperature equal to or higher than about 600° C.

That is, substantially, there is no limit in the kind of the first pre-coat film in the second embodiment. Meanwhile, it is preferable to appropriately set the kind of the second pre-coat film formed on, e.g., the inner wall of the processing chamber 1 by considering the kind of the film formed on the target substrate.

Further, though the SiCN film is formed on the surface of the wafer W as a hard mask in the above-described embodiments of the present invention, it is also preferable that a SiCO film (carbon containing silicon oxide film) is formed as the hard mask by using trimethysilane gas as a source gas and $O_2$ gas as a plasma gas. In addition, it is also preferable that a SiCH film (carbon and hydrogen containing silicon film) is formed as the hard mask by using trimethysilane gas as a source gas and Ar gas as a plasma gas.

Moreover, the film forming apparatus for performing the present invention is not limited to the above-mentioned plasma processing apparatus, but a parallel plate electrode plasma processing apparatus, a thermal CVD apparatus, and the like can be employed instead.

Further, the organic silane gas used to form the SiCN, the SiCO or the SiCH film is not limited to the trimethylsilane gas, but it can be $CH_3SiH_3$, $(CH_3)_2SiH_2$, $(CH_3)_3SiH$, $(CH_3)_4Si$, $(CH_3)_2Si(OC_2H_5)_2$, $(CH_3)_2Si(OCH_3)_2$, $CH_3Si(OC_2H_5)_3$, $CH_3Si(OCH_3)_3$, $(HCH_3SiO)_4$ (cyclic structure), $((CH_3)_3Si)_2O$, $(H(CH_3)_2Si)_2O$, $(H_2CH_3Si)_2O$, $((CH_3)_2SiO)_3$, $(CH_3ASiO)_3$, $((CH_3)_2SiO)_4$, $(CH_3ASiO)_4$, or the like. Here, the last three compounds have cyclic structures, and "A" is a vinyl group ($CH-CH_3$).

What is claimed is:

1. A film forming method comprising:
   pre-coating an inner wall of a processing chamber, including a surface of a mounting table made of ceramic containing a metal oxide and disposed in the processing chamber, with a first silicon-containing nonmetal thin film, by introducing a processing gas containing an inorganic silane gas into the processing chamber;
   mounting a dummy substrate on the mounting table pre-coated with the first nonmetal thin film;
   removing the first nonmetal thin film formed on other regions of the mounting table than that covered with the dummy substrate, by introducing a cleaning gas for removing the first nonmetal thin film into the processing chamber;
   pre-coating the inner wall of the processing chamber and the surface of the mounting table on which the dummy substrate is mounted with a second silicon-containing nonmetal thin film, by introducing a processing gas containing an organic silane gas;
   unloading the dummy substrate from the processing chamber;
   mounting a target substrate on the mounting table after the dummy substrate is unloaded; and
   forming a silicon-containing nonmetal thin film on a surface of the target substrate mounted on the mounting table, by introducing a processing gas containing an organic silane gas.

2. The film forming method of claim 1, wherein the inorganic silane gas is a monosilane gas, a disilane gas or a dichlorosilane gas.

3. The film forming method of claim 1, wherein the silicon containing nonmetal thin film formed by using the processing gas containing the organic silane gas is a carbon and nitrogen containing silicon film (SiCN film), a carbon-containing silicon oxide film (SiCO film) or a carbon and hydrogen -containing silicon film (SiCH film).

4. The film forming method of claim 1, wherein a titanium oxide, which is a metal oxide, is contained in the mounting table as a binder.

5. A computer executable program, executed by a computer for controlling a film forming apparatus including:
   a processing chamber in which a mounting table for mounting a substrate thereon is disposed;
   a first processing gas supply unit for introducing a processing gas containing an inorganic silane gas into the processing chamber;
   a second processing gas supply unit for introducing a processing gas containing an organic silane gas into the processing chamber; and
   a substrate transfer mechanism for transferring the substrate to/from the mounting table,
   wherein the computer executable program comprises instruction to perform the film forming method described in claim 1.

* * * * *